United States Patent
Momeni et al.

(10) Patent No.: US 9,915,691 B2
(45) Date of Patent: Mar. 13, 2018

(54) METHOD AND CONTROL UNIT FOR ASCERTAINING A CAPACITANCE VALUE OF A DATA BUS

(71) Applicant: Robert Bosch GmbH, Stuttgart (DE)

(72) Inventors: Massoud Momeni, Filderstadt (DE); Guenter Weiss, Walheim (DE); Matthias Siemss, Gomaringen (DE); Timo Weiss, Hemmingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 33 days.

(21) Appl. No.: 14/571,434

(22) Filed: Dec. 16, 2014

(65) Prior Publication Data

US 2015/0177299 A1    Jun. 25, 2015

(30) Foreign Application Priority Data

Dec. 19, 2013    (DE) ..................... 10 2013 226 642

(51) Int. Cl.
*G01R 27/26* (2006.01)
*G06F 13/40* (2006.01)

(52) U.S. Cl.
CPC ..... *G01R 27/2605* (2013.01); *G06F 13/4086* (2013.01)

(58) Field of Classification Search
CPC ..................... G01R 27/2605; G06F 13/4086
USPC .................................................. 324/658–690
See application file for complete search history.

(56) References Cited

U.S. PATENT DOCUMENTS

| | | | | |
|---|---|---|---|---|
| 5,615,225 A | * | 3/1997 | Foster ..................... | H04M 3/26 370/241 |
| 6,177,801 B1 | * | 1/2001 | Chong ................. | G01R 31/024 324/520 |
| 6,226,356 B1 | * | 5/2001 | Brown ..................... | H04B 3/04 379/1.04 |
| 6,397,158 B1 | | 5/2002 | Ahmad et al. | |
| 2005/0289408 A1 | * | 12/2005 | Jani ....................... | G01R 31/088 714/712 |
| 2014/0375359 A1 | * | 12/2014 | Deloge ............ | H03K 19/00338 327/108 |
| 2015/0301919 A1 | * | 10/2015 | Huang ............. | G01R 31/31719 713/340 |

FOREIGN PATENT DOCUMENTS

DE    10 2012 201 596    8/2013

* cited by examiner

*Primary Examiner* — Jeff Natalini
(74) *Attorney, Agent, or Firm* — Norton Rose Fulbright US LLP; Gerard Messina

(57) ABSTRACT

A method for ascertaining a load capacitance of a data bus includes reading in and a determining task. In the reading in, a scaling factor of a synchronization pulse of the data bus is read in. In the determining, the load capacitance is determined using the scaling factor and a processing rule.

14 Claims, 3 Drawing Sheets

METHOD AND CONTROL UNIT FOR ASCERTAINING A CAPACITANCE VALUE OF A DATA BUS

RELATED APPLICATION INFORMATION

The present application claims priority to and the benefit of German patent application no. 10 2013 226 642.1, which was filed in Germany on Dec. 19, 2013, the disclosure of which is incorporated herein by reference.

FIELD OF THE INVENTION

The present invention relates to a method for ascertaining a capacitance value of a data bus, to a corresponding control unit, and to a corresponding computer program product.

BACKGROUND INFORMATION

The so-called in-circuit test (ICT) may be used, among other things, to test populated printed circuit boards in electronics production.

SUMMARY OF THE INVENTION

Against this background, the approach presented here introduces a method for ascertaining a capacitance value of a data bus, as well as a control unit using this method, and finally a corresponding computer program product as described herein. Advantageous embodiments are derived from the particular subclaims and the following description.

A data bus as a whole may be operated with a variable number of clients and/or with a variable length. This results in a large variance of the electrical capacitance of the overall system. A synchronization pulse may be used to chronologically synchronize a transmission and/or reception of information. To emit the synchronization pulse with an amplitude which is within a tolerance range, it is necessary to adapt a transmission energy for the synchronization pulse. The adaptation may be carried out using a scaling factor. The scaling factor is thus required to operate the data bus.

Since the necessary transmission energy is dependent on an electrical capacitance of the overall system, the scaling factor represents a degree of the capacitance. The scaling factor may thus be used to determine the capacitance.

By determining the capacitance using the scaling factor which is present anyhow, other methods and devices for determining the capacitance may be eliminated. The elimination allows costs to be saved. Since the scaling factor is present during ongoing operation, the capacitance may be determined during operation. In this way, it is possible to directly respond to changes in the data bus.

A method is introduced for ascertaining a capacitance value of
a data bus, the method including the following steps:
reading in a scaling factor of a synchronization pulse of the data bus; and
determining the capacitance value using the scaling factor and a processing rule.

Furthermore a control unit is introduced for ascertaining a capacitance value of a data bus, the control unit including the following features:
an interface for reading in a scaling factor of a synchronization pulse of the data bus; and
a device for determining the capacitance value using the scaling factor and a processing rule.

An object of the present invention may also be quickly and efficiently achieved by this embodiment variant of the present invention in the form of a control unit.

A control unit in the present invention may be understood to mean an electrical device which processes sensor signals and outputs control signals and/or data signals as a function thereof. The control unit may include an interface which may be configured as hardware and/or software. In the case of a hardware design, the interfaces may, for example, be part of a so-called system ASIC which includes a wide variety of functions of the control unit. However, it is also possible for the interfaces to be separate integrated circuits, or to be at least partially made up of discrete components. In the case of a software design, the interfaces may be software modules which are present on a microcontroller, for example, in addition to other software modules.

A capacitance value may be understood to mean an electrical capacitance of electrical and electronic components of the data bus and of electrical lines of the data bus. A scaling factor may be information for adapting an energy output during the provision of a synchronization pulse. The scaling factor may also be configured to adapt a current amplitude for generating the synchronization pulse.

The processing rule may represent a relationship between the scaling factor and the capacitance value. The processing rule may be stored in a formula. It is also possible for discrete values for value pairs of the capacitance value and of the scaling factor to be stored in a table. The capacitance value may be quickly and clearly determined as a result of the processing rule.

A load capacitance of clients of the data bus may be determined as the capacitance value. In this way an electrical function of the clients may be checked.

A capacitance of a line of the data bus may be determined as the capacitance value. In this way a line length of the data bus may be checked, for example.

A circuit capacitance of a receiver circuit of the data bus may be determined as the capacitance value. In this way, an electrical function of the receiver circuit may be checked.

An overall capacitance of the data bus may be determined as the capacitance value. In this way an electrical function of the overall system may be checked.

The method may include a step of providing, a step of detecting, and a step of adapting. In the step of providing, the synchronization pulse may be provided on the data bus with a defined pulse duration and using a scaling factor. In the step of detecting, an amplitude of the synchronization pulse may be detected. In the step of adapting, the scaling factor may be adapted for a subsequent step of providing, using a difference between the amplitude and a setpoint value for the amplitude, to obtain an adapted scaling factor. In the step of reading in, the adapted scaling factor may be read in as the scaling factor. By repeatedly determining the load capacitance, it is possible to respond to changes of the load capacitance during ongoing operation.

In addition, a computer program product is advantageous, having program code which may be stored on a machine-readable carrier such as a semiconductor memory, a hard disk memory or an optical memory, and which is used to carry out the method according to one of the specific embodiments described above, if the program product is executed on a computer or a device.

The approach presented here is described in greater detail hereafter based on the accompanying drawings by way of example.

In the following description of favorable exemplary embodiments of the present invention, identical or similar reference numerals are used for similarly acting elements shown in the different figures, and a repeated description of these elements is dispensed with.

DETAILED DESCRIPTION

Figure 1:
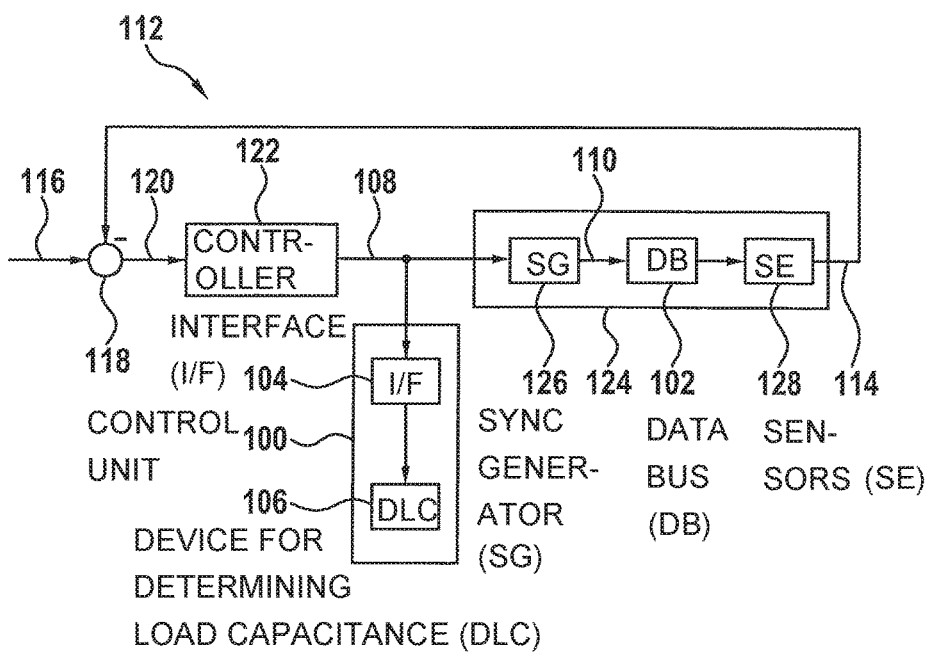
FIG. 1 shows a block diagram of a control unit for ascertaining a load capacitance of a data bus according to one exemplary embodiment of the present invention.

Peripheral sensors 128 for occupant protection systems generally use current interfaces, for example PAS4 or PSI5, for transmitting sensor data to the central control unit (ECU) 300.

In current interfaces of the latest generation (PSI5), the bus operation with multiple sensors 128 at a receiver 300 is made possible with the aid of synchronization. For the function of the synchronization, control unit ECU 300 generates a working clock in the form of a voltage pulse which is detected by sensors 128 at bus 102 and identifies the start of a new cycle for the data transmission. This voltage pulse is referred to as a synchronization pulse and is created with the aid of current sources 306 and current sinks 308, which charge or discharge the bus load.

The different type and number of sensors 128 and filters, depending on the application, in control unit 316 of receiver 300 contribute to the large range of load capacitances which must be tolerated.

To implement the filters, the printed circuit board of control unit 316 is populated with capacitors.

The so-called in-circuit test (ICT) may be used, among other things, to test populated printed circuit boards in electronics production.

To be able to implement the in-circuit test method, adapters having contact needles are used for each test point to be examined. The delivery times for these adapters are very long and costs for them are very high. Additional costs may furthermore be incurred by layout changes, which necessitate a new adapter.

The approach presented here replaces the in-circuit test method for capacitors of an integrated circuit at a PSI5 interface and thus saves testing costs.

The method presented here allows not only the existence, but also the value of the capacitors or of the load capacitance at the current interface, including the capacitance of the sensors, to be measured and the measured value to be represented.

FIG. 1 shows a block diagram of a control unit 100 for ascertaining a load capacitance of a data bus 102 according to one exemplary embodiment of the present invention. Control unit 100 includes an interface 104 and a device 106 for determining the load capacitance. Interface 104 is configured to read in a scaling factor 108 for a synchronization pulse 110 of data bus 102. Device 106 for determining is configured to determine the load capacitance using scaling factor 108 and a processing rule. Scaling factor 108 is updated using a control loop 112. An actual amplitude 114 of a synchronization pulse 110 lying chronologically in the past is used as the control variable in control loop 112. A predetermined setpoint amplitude 116 for synchronization pulse 110 is used as a guide variable. Control variable 114, i.e., actual amplitude 114, is fed back via a negative feedback system 118. The control deviation is thus a difference 120 between setpoint amplitude 116 and actual amplitude 114. Control deviation 120 is an input variable of a controller 122, which has scaling factor 108 as the output variable. Scaling factor 108 is an input variable of controlled system 124, which here includes a synchronization generator 126 for providing synchronization pulse 110, data bus 102, and sensors 128 at data bus 102.

Figure 2:
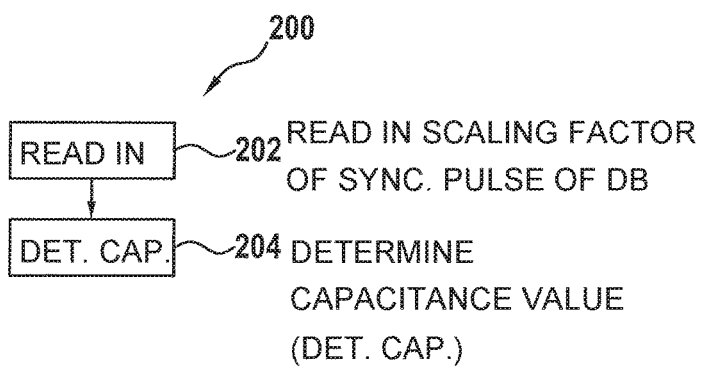
FIG. 2 shows a flow chart of a method for ascertaining a load capacitance of a data bus according to one exemplary embodiment of the present invention.

FIG. 2 shows a flow chart of a method 200 for ascertaining a capacitance value of a data bus according to one exemplary embodiment of the present invention. Method 200 includes a step 202 of reading in and a step 204 of determining. In step 202 of reading in, a scaling factor of a synchronization pulse of the data bus is read in. In step 204 of determining, the capacitance value is determined using the scaling factor and a processing rule.

In one exemplary embodiment, the processing rule represents a relationship between the scaling factor and the capacitance value.

In one exemplary embodiment, the processing rule is stored in a formula.

In one exemplary embodiment, discrete values for value pairs of the capacitance value and scaling factor are stored in a table.

In one exemplary embodiment, a load capacitance of clients of the data bus is determined as the capacitance value in step 204 of determining. For this purpose, the clients are connected to the pulse generator and at least one synchronization pulse is provided. A receiver circuit may be disconnected from the data bus for this purpose.

In one exemplary embodiment, a dedicated processing rule is used to determine the load capacitance in step 204 of determining.

In one exemplary embodiment, a capacitance of a line of the data bus is determined as the capacitance value in step 204 of determining. For this purpose, both the clients and the receiver circuit are disconnected from the data bus. At least one synchronization pulse is then only provided in the line.

In one exemplary embodiment, a dedicated processing rule is used to determine the line capacitance in step 204 of determining.

In one exemplary embodiment, a circuit capacitance of a receiver circuit of the data bus is determined as the capacitance value in step 204 of determining. For this purpose, the line of the data bus is disconnected from the pulse generator, while the pulse generator is connected to the receiver circuit. At least one synchronization pulse is then only provided in the receiver circuit.

In one exemplary embodiment, an overall capacitance of the data bus is determined as the capacitance value in step 204 of determining. For this purpose, the synchronization pulse is provided in the entire data bus.

In one exemplary embodiment, method 200 includes a step of providing, a step of detecting, and a step of adapting. In the step of providing, the synchronization pulse is provided on the data bus with a defined pulse duration and using a scaling factor. In the step of detecting, an amplitude of the synchronization pulse is detected. In the step of adapting, the scaling factor is adapted for a subsequent step of providing, using a difference between the amplitude and a setpoint value for the amplitude, to obtain an adapted scaling factor.

In step 204 of reading in, the adapted scaling factor is read in as the scaling factor.

In other words, FIG. 2 describes an ascertainment of the printed circuit board capacitance by regulating the synchronization pulse of a current interface to eliminate the in-circuit test (ICT).

In one exemplary embodiment, the ascertainment of the load capacitance by regulating the synchronization pulse of a current interface is described.

Figure 3:
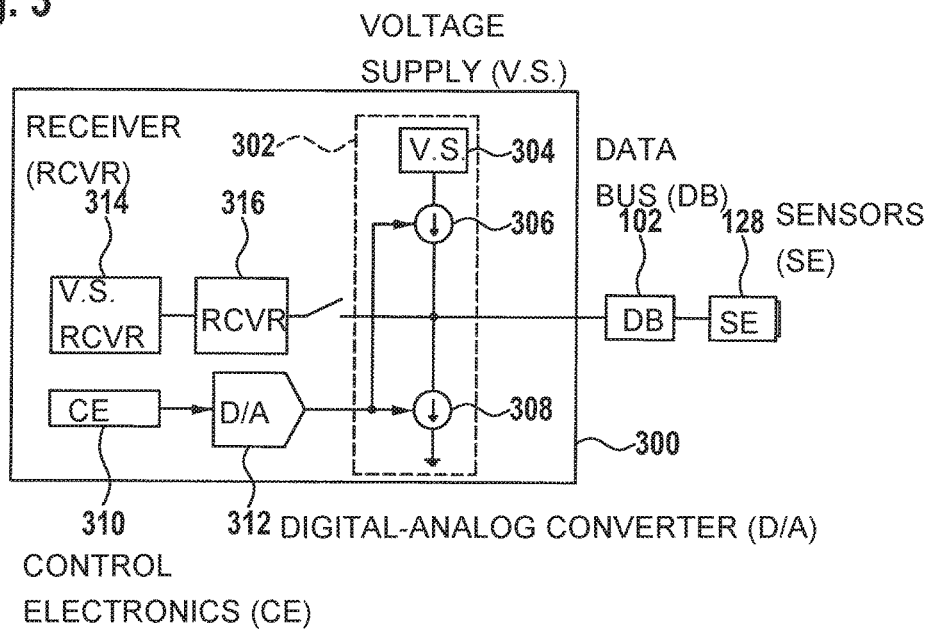
FIG. 3 shows an illustration of a receiver for a data bus having a device for providing a synchronization pulse.

FIG. 3 shows an illustration of a receiver 300 of a PSI interface for a data bus 102 having a device 302 for providing a synchronization pulse. Device 302 includes a voltage supply 304, a current source 306 and a current sink 308. Current source 306 and current sink 308 are activated by a digital control electronics 310 and a digital-to-analog converter 312 to provide the synchronization pulse on data bus 102 for sensors 128 on the data bus. The receiver furthermore includes a voltage supply 314 for the receiver and a receiver circuit 316. Receiver circuit 316 is configured to be disconnectable from, or connectable to, data bus 102 or device 302 for providing.

In one exemplary embodiment which is not shown, data bus 102 including clients 128 is configured to be connectable to, or disconnectable from, device 302 for providing.

The approach presented here uses the result of this control algorithm to ascertain the capacitance of the capacitor connected on the printed circuit board or the load capacitance in the installed control unit.

In this way, the in-circuit test step may be saved. Moreover, by measuring the load capacitance in the installed control unit, it is also possible to detect the correct connection of the sensors to the receiver, not only their existence.

The approach presented here allows additional testing costs for the in-circuit test method and for the diagnosis of the bus configuration to be saved. Moreover, no additional space is required on the silicon chip, and no additional time is required for carrying out the measurement since it takes place during ongoing operation.

The circuit on which receiver 300 is based is shown in FIG. 3. Circuit 302, which generates the synchronization pulse and is composed of digital control electronics 310, digital-to-analog converter 312, current source 306, current sink 308 and voltage supply 304 for current source 306, is referred to as synchronization pulse generator 302.

Digital control electronics 310 uses, among other things, the achieved synchronization pulse amplitude to regulate the synchronization pulse. The synchronization pulse amplitude is dependent on the capacitive load and is ascertained by the evaluation of the bus voltage.

Figure 4:
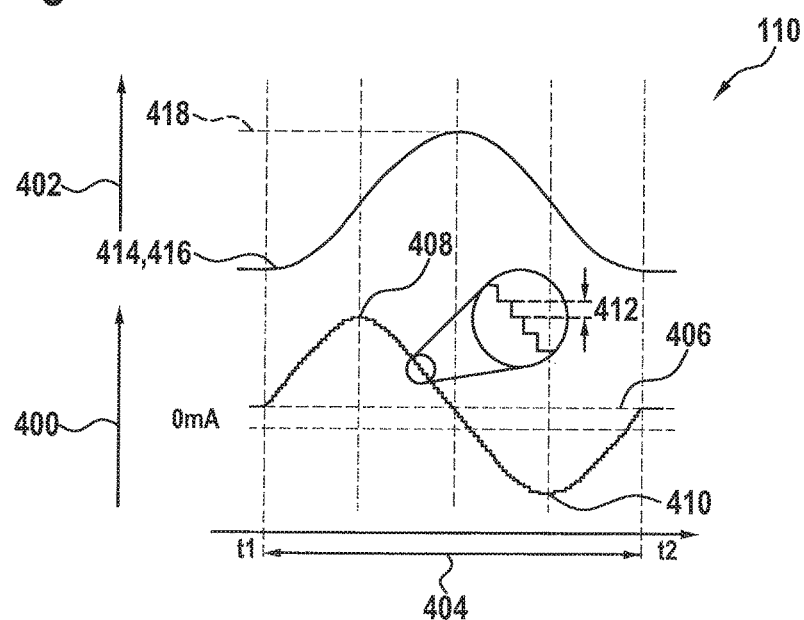
FIG. 4 shows an illustration of a bus voltage and a bus current during a synchronization pulse according to one exemplary embodiment of the present invention.

FIG. 4 shows an illustration of a bus current 400 and of a bus voltage 402 during a synchronization pulse 110 according to one exemplary embodiment of the present invention. Synchronization pulse 110 is provided by a device for providing, as it is shown in FIG. 3. Synchronization pulse 110 is provided as electric current flow 400 on the data bus. Electric current flow 400 results in an electric voltage 402 in the data bus.

Synchronization pulse 110 begins at a starting point in time t1 and ends at an ending point in time t2. Between starting point in time t1 and ending point in time t2, synchronization pulse 110 has a pulse duration 404 $t_{sync}$. A quiescent current 406 is present on the data bus prior to starting point in time t1. As of the starting point in time t1, current flow 400 is determined by the current source. The current source causes a sinusoidal change or oscillation of current flow 400. One entire oscillation takes place within pulse duration 404. Starting with starting point in time t1, current flow 400 is increased proceeding from quiescent current 406. Current flow 400 is increased to a maximum 408, thereafter is reduced to a minimum 410, and then increased again to the value of quiescent current 406.

Minimum 410 is in the range of negative electric current flow or a reversal of a flow direction of current flow 400. In the negative range, the current flows into the current sink.

The increasing or decreasing takes place with a discrete number of steps. The steps approximate the sinusoidal oscillation via different step widths. The number of steps is dependent on a resolution of the digital-to-analog converter in FIG. 3. A step height 412 of the steps is defined by the scaling factor to influence an amplitude of current flow 400.

Current flow 400 of synchronization pulse 110 varies bus voltage 402 as a function of a capacitance of the data bus. Bus voltage 402 also has a quiescent value 414 prior to starting point in time t1. Bus voltage 402 also has a sinusoidal progression during synchronization pulse 110. The oscillation of bus voltage 402 has a phase offset of three quarters of pulse duration 404. Synchronization pulse 110 thus starts at its minimal value 416. Minimal value 416 corresponds to quiescent value 414. Voltage 402 increases from minimal value 416 to a maximal value 418 and after maximal value 418 drops again to minimal value 416. Maximal value 418 of voltage 402 is achieved when current 400 drops below quiescent current 406, i.e., at half the pulse duration 404. A difference between maximal value 418 and minimal value 416 is a voltage amplitude. The voltage amplitude is dependent on the load capacitance in the data bus.

To maintain the voltage amplitude at a setpoint value, the scaling factor is adapted for the steps of the current flow. If the voltage amplitude is smaller than the setpoint value, the scaling factor is increased. If the voltage amplitude is greater than the setpoint value, the scaling factor is reduced.

In the approach presented here, the scaling factor is read out since the scaling factor is proportional to the load capacitance of the data bus. In this way, the load capacitance may be inferred at any time.

In other words, FIG. 4 shows bus voltage 402 and bus current 400 during a synchronization pulse 110. Currents 400 greater than zero milliamperes are provided by the current source, and currents 400 smaller than zero milliamperes mean a current flow into the sink. At point in time t1, the synchronization pulse current source of FIG. 3 takes over the quiescent current from the voltage supply of the receiver. Conversely, the quiescent current is again taken over from the voltage supply at point in time t2.

To meet the requirements in regard to shape and flank steepness, the synchronization pulse is regulated as a function of the quiescent current and the bus capacitance.

The current source and the current sink are activated by the digital part as shown in FIG. 4. Duration 404 of synchronization pulse t-sync is kept constant, while step height 412 is scaled in accordance with the information from the amplitude evaluation. Step height 412 is calculated by multiplying the minimal possible step height with a scaling factor. The minimal step height is derived from the minimal current from the current source or the current sink. The scaling factor is increased if synchronization pulse 110 is too low, and it is reduced if synchronization pulse 110 is too high, until the correct level, and thus the correct shape, have been reached. The steps in output current 400 are integrated based on the load capacitance and thus result in a smoothed output voltage 402.

As a result of the monotonic and calculable increase of the scaling factor with the load capacitance, the scaling factor may be used to ascertain the load capacitance installed on the printed circuit board and connected in the installed control unit. Since the integrated circuit for generating and regulating the synchronization pulse is already present in the PSI5 interface, this method for ascertaining the load capacitance is space and cost neutral.

The measurement of the load capacitance is carried out during ongoing operation. The measured value may be output by one of the communications protocols which are used.

The measurement of the load capacitance is carried out exclusively by the circuit which is required anyhow for the current interface.

In PSI5 interfaces, the large currents required for this type of measurements are only provided by the synchronization pulse generator. The regulating behavior of the synchronization pulse as a basis for determining the load capacitance is easily detectable on the oscilloscope by the variation of the bus capacitance.

Figure 5:
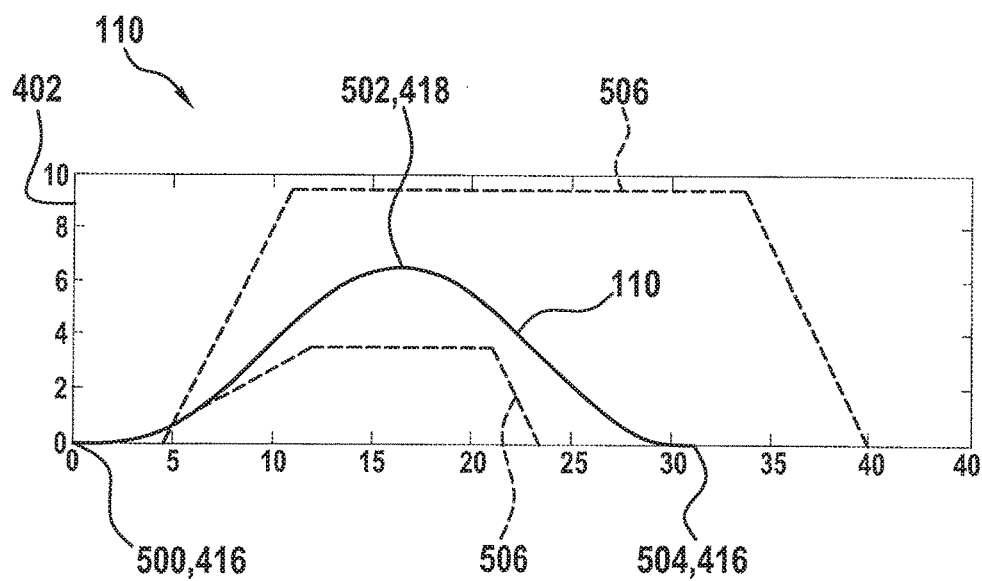
FIG. 5 shows an illustration of a shape and a temporal behavior of a synchronization pulse on a data bus.

FIG. 5 shows an illustration of a shape and a temporal behavior of an electric voltage 402 of a synchronization pulse 110 on a data bus. Synchronization pulse 110 corresponds to the synchronization pulse of FIG. 4. Synchronization pulse 110 has a sinusoidal progression. Synchronization pulse 110 begins at a starting point in time 500 at a minimal value 416, increases to a maximal value 418 by a middle point in time 502, and drops again to minimal value 416 by an ending point in time 504. Maximal value 418 is in the middle between minimal values 416. A pulse duration of synchronization pulse 110 is present between starting point in time 500 and ending point in time 504. An amplitude of synchronization pulse 110 is limited by minimal value 416 and maximal value 418. Synchronization pulse 110 has specification boundaries 506 within which it is to progress. Specification boundaries 506 cover a tolerance range for maximal value 418, and thus the amplitude, and a tolerance range for ending point in time 504. Since synchronization pulse 110 is symmetrical, this also results in a tolerance range for middle point in time 502.

Figure 6:
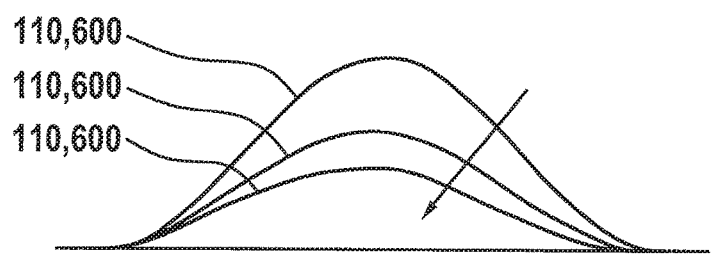
FIG. 6 shows an illustration of different synchronization pulses on a data bus as a function of a load capacitance of the data bus.

FIG. 6 shows an illustration of different voltage curves 600 of synchronization pulses 110 on a data bus as a function of a load capacitance of the data bus. The basic shape of voltage curves 600 corresponds to the voltage progression of FIG. 4. Three voltage curves 600 are shown for three synchronization pulses 110. Synchronization pulses 110 were generated in each case with identical parameters. Synchronization pulses 110 thus all have the same pulse duration. In particular, synchronization pulses 110 were generated using identical scaling factors. In contrast, voltage curves 600 have different amplitudes.

The different amplitudes result from differences in the load capacitance of the data bus. The amplitude decreases as the load capacitance increases. For example, the load capacitance may vary due to different line lengths. The load capacitance may also vary due to a different number of sensors on the data bus. Moreover, a capacitance within an evaluation circuit of the data bus may vary.

In other words, FIG. 6 shows a synchronization pulse 110 as a function of the load capacitance when the regulation is deactivated. In the case of a fixedly set scaling factor, the synchronization pulse amplitude decreases as the load capacitance increases. Conversely this means that the scaling factor increases with a constant amplitude.

The load capacitance may also be charged via a known current using a known resistor. The value of the load capacitance may be inferred from a measurement of the time constant. A switch is necessary for this purpose, which connects the resistor for the measurement and disconnects it for the ongoing operation.

For this method, a switch, a resistor on the bus, comparators, and an additional digital logic circuit are required for determining charging times.

Using the approach presented here, in contrast, an integrated resistor having large tolerances in the range of 20% or more may be dispensed with. Depending on the resistance value, considerable space requirement on the chip, and thus product costs, may be saved. As an alternative, an external resistor may be dispensed with, even though it may have narrow tolerances. In this way, an additional component is eliminated, and the narrower the tolerance of the resistance value is established, the greater is the cost reduction that is obtained. The situation is similar with the switch. Whether or not it is integrated, the evaluation of the scaling factor saves chip or printed circuit board space.

The approach presented here allows the current interface to be activated without delay.

In the method presented here, the measurement is carried out after the interface has been activated, i.e., during ongoing operation. No additional measuring step must be carried out.

The described exemplary embodiments shown in the figures are selected only by way of example. Different exemplary embodiments may be combined with each other completely or with respect to individual features. It is also possible to supplement one exemplary embodiment with features of another exemplary embodiment.

Moreover, the method steps presented here may be carried out repeatedly and in a different order than the one described.

If one exemplary embodiment includes an "and/or" link between a first feature and a second feature, this should be read in such a way that the exemplary embodiment according to one specific embodiment includes both the first feature and the second feature, and according to an additional specific embodiment includes either only the first feature or only the second feature.

What is claimed is:

1. A method for ascertaining a load capacitance value of a data bus, the method comprising:
   reading in, via an interface of a control unit, a scaling factor of a synchronization pulse of the data bus; and
   determining the load capacitance value using the scaling factor and a processing rule;
   updating the scaling factor using a control loop;
   wherein an actual amplitude of a prior synchronization pulse is used as a control variable in the control loop, wherein a predetermined setpoint amplitude for the synchronization pulse is provided, wherein the control variable, which is the actual amplitude, is fed back via a negative feedback system, so that a control deviation, for updating the scaling factor, is determined as a difference between the setpoint amplitude and the actual amplitude,
   wherein the processing rule represents a relationship between the scaling factor and the load capacitance value,
   wherein the load capacitance value includes capacitances of clients on the data bus, and wherein the clients include sensors for an occupant protection system.

2. The method of claim 1, wherein the load capacitance value includes a capacitance of a line of the data bus.

3. The method of claim 1, wherein the load capacitance value includes a circuit capacitance of a receiver circuit of the data bus.

4. The method of claim 1, wherein the load capacitance value includes an overall capacitance of the data bus, wherein the overall capacitance includes the capacitances of the clients, the line of the data bus, and the receiver circuit of the data bus.

5. The method of claim 1, further comprising:
providing the synchronization pulse on the data bus with a defined pulse duration and using a scaling factor; and
detecting the actual amplitude of the synchronization pulse; and
adapting the scaling factor for subsequently providing, using the difference between the amplitude and the setpoint value for the amplitude to obtain an adapted scaling factor;
wherein in the reading in, the adapted scaling factor is read in as the scaling factor.

6. The method of claim 1, wherein in the determining:
the load capacitance value further includes at least one of a circuit capacitance of a receiver circuit of the data bus and a capacitance of a line of the data bus.

7. A control unit for ascertaining a load capacitance value of a data bus, comprising:
an interface for reading in a scaling factor of a synchronization pulse of the data bus; and
a device for determining the load capacitance value using the scaling factor and a processing rule;
an updating arrangement to update the scaling factor using a control loop, wherein an actual amplitude of a prior synchronization pulse is used as a control variable in the control loop, wherein a predetermined setpoint amplitude for the synchronization pulse is provided, wherein the control variable, which is the actual amplitude, is fed back via a negative feedback system, so that a control deviation, for updating the scaling factor, is determined as a difference between the setpoint amplitude and the actual amplitude,
wherein the processing rule represents a relationship between the scaling factor and the load capacitance value,
wherein the load capacitance value includes capacitances of clients on the data bus, and
wherein the clients include sensors for an occupant protection system.

8. A non-transitory computer readable medium having a computer program, which is executable by a processor, comprising:
a program code arrangement having program code for ascertaining a load capacitance value of a data bus, by performing the following:
reading in a scaling factor of a synchronization pulse of the data bus; and
determining the capacitance value using the scaling factor and a processing rule;
updating the scaling factor using a control loop;
wherein an actual amplitude of a prior synchronization pulse is used as a control variable in the control loop, wherein a predetermined setpoint amplitude for the synchronization pulse is provided, wherein the control variable, which is the actual amplitude, is fed back via a negative feedback system, so that a control deviation, for updating the scaling factor, is determined as a difference between the setpoint amplitude and the actual amplitude,
wherein the processing rule represents a relationship between the scaling factor and the load capacitance value,
wherein the load capacitance value includes capacitances of clients on the data bus, and
wherein the clients include sensors for an occupant protection system.

9. The computer readable medium of claim 8, wherein the load capacitance value includes a capacitance of a line of the data bus.

10. The computer readable medium of claim 8, wherein the load capacitance value includes a circuit capacitance of a receiver circuit of the data bus.

11. The computer readable medium of claim 8, wherein the load capacitance value includes an overall capacitance of the data bus, wherein the overall capacitance includes the capacitances of the clients, the line of the data bus, and the receiver circuit of the data bus.

12. The computer readable medium of claim 8, further comprising:
providing the synchronization pulse on the data bus with a defined pulse duration and using a scaling factor; and
detecting the actual amplitude of the synchronization pulse; and
adapting the scaling factor for subsequently providing, using the difference between the amplitude and the setpoint value for the amplitude to obtain an adapted scaling factor;
wherein in the reading in, the adapted scaling factor is read in as the scaling factor.

13. The computer readable medium of claim 12, wherein in the determining:
the load capacitance value further includes at least one of a circuit capacitance of a receiver circuit of the data bus and a capacitance of a line of the data bus.

14. The computer readable medium of claim 8, wherein in the determining:
the load capacitance value further includes at least one of a circuit capacitance of a receiver circuit of the data bus and a capacitance of a line of the data bus.

* * * * *